United States Patent [19]

Burton et al.

[11] Patent Number: 4,916,363

[45] Date of Patent: Apr. 10, 1990

[54] BALLAST

[75] Inventors: Charles A. Burton, Columbus, Ohio; Larry J. Costa; Dail L. Swanson, both of Danville, Ill.

[73] Assignee: Valmont Industries, Inc., Valley, Nebr.

[21] Appl. No.: 257,528

[22] Filed: Oct. 14, 1988

[51] Int. Cl.[4] .................. H05K 5/04

[52] U.S. Cl. .................. 315/276; 336/90; 174/DIG. 2; 361/377

[58] Field of Search .................. 315/276; 336/90, 96; 174/DIG. 2; 361/377

[56] References Cited

U.S. PATENT DOCUMENTS

| | | | |
|---|---|---|---|
| 2,489,245 | 11/1949 | Sola | 174/DIG. 2 X |
| 3,360,687 | 12/1967 | Riesland | 361/377 |
| 3,655,906 | 4/1972 | Robb | 174/DIG. 2 X |

FOREIGN PATENT DOCUMENTS

| | | | |
|---|---|---|---|
| 0751052 | 1/1967 | Canada | 174/DIG. 2 |

*Primary Examiner*—Eugene R. LaRoche
*Assistant Examiner*—Robert J. Pascal
*Attorney, Agent, or Firm*—Zarley, McKee, Thomte, Voorhees & Sease

[57] ABSTRACT

An improved ballast for a fluorescent lamp comprising a base having a core mounted thereon with a plurality of coils operatively electrically associated with the core with each of the coils having at least one conductor extending therefrom. An electrical connector is positioned adjacent the coils and has a plurality of connectors associated therewith which are electrically connected to predetermined conductors. A component subassembly is electrically connected to predetermined connectors. A case is positioned over the core, coils, connectors and the component subassembly. The case is provided with an access opening formed therein for providing access to at least a portion of the connectors so at least a portion of a wiring harness may be inserted therethrough for selective connection to predetermined connectors.

38 Claims, 10 Drawing Sheets

BALLAST

BACKGROUND OF THE INVENTION

This invention relates to an improved ballast for a fluorescent lamp.

Conventional ballasts for fluorescent lamps are usually positioned within a ballast case comprised of a flat base portion and a case or cover portion secured thereto. The conventional ballasts normally include a core and coil subassembly mounted on one end of the base portion with the terminations of the coils extending therefrom. Conventionally, the layers of windings are separated by insulating material such as Kraft paper or the like. The use of paper insulation material between the layers often results in a higher operating temperature for the core and coil subassembly thereby effectively reducing the life of the ballast. The core and coil subassembly, after assembly, is normally impregnated with an asphalt wax material. The core and coil subassembly is then preferably positioned in the case so that the assembly is spaced from the top surface of the case and the sides of the ballast case for heat and sound insulation purposes, but the construction of the prior art core and coil subassembly makes such a feat extremely difficult. A capacitor/resistor subassembly is normally mounted in the other end of the case portion and usually comprises at least one capacitor and at least one resistor. Such a subassembly is sometimes referred to as a component subassembly. During the manufacture of the ballast, the leads or terminals of the capacitor(s) and resistor(s) are electrically connected to predetermined coil terminations. Elongated, flexible, external leads are also electrically connected, during the manufacturing process, to predetermined coil terminations. The total subassembly is then encased in an asphalt, silica sand potting compound. The base portion is then positioned over the ballast components and secured to the case portion with the flexible leads extending outwardly from the case. The external leads are subsequently electrically connected to leads or terminals in the lamp fixture.

The above-described ballasts, although generally satisfactory in operation, suffer some drawbacks or disadvantages. One disadvantage of the prior art ballasts is that different lamp manufacturers require leads of different lengths thereby requiring the ballast manufacturer to produce, and inventory, ballasts having various lead lengths. Further, each individual manufacturer may require various length leads to accommodate various lamp fixtures.

A further disadvantage of the prior art ballasts is that the external leads, which extend from the ballast, often interfere with other assembly operations. Yet another disadvantage is that the conventional ballast is not easily replaced by the end user should the ballast fail. Still another disadvantage is that the conventional ballast does not lend itself to potential modular product line extensions.

SUMMARY OF THE INVENTION

In the preferred ballast of this invention, a unitized bobbin is provided which has winding sections provided thereon with various coil windings wrapped thereon such as a secondary winding, one or more primary windings, and cathode coil windings. A terminal pin support means is positioned at one end of the bobbin and has a plurality of terminal pins extending therefrom. The terminations of the various coils or conductors are electrically connected to predetermined terminal pins. The bobbin is mounted on a laminated, welded core and the components, except for the terminal pins, are impregnated with an asphalt wax material. The core and coil subassembly is mounted in one end of a case and has an electrical connector means positioned at one end thereof which is electrically connected to the terminal pins extending from the core and coil subassembly. The bobbin and the core, except for the terminal pins are then encased in an asphalt, silica sand potting compound. A resistor/capacitor subassembly is also electrically connected to the electrical connector means. A base is positioned over the core and coil subassembly and the resistor/capacitor subassembly and is secured to the case. The case is provided with an access opening formed therein to facilitate the extension or insertion of one end of a wiring harness therethrough which is electrically connected to the electrical connector to complete the desired wiring circuit.

The ballast lends itself to mechanized manufacture and can be supplied to various lamp manufacturers without any lamp leads (external leads) associated therewith so that the lamp manufacturer may utilize the particular length leads required by that manufacturer. The fact that the wiring harness may be removably secured to the electrical connector means enables the end user to easily replace the ballast should the ballast fail. Further, the construction of the ballast is such that it lends itself to potential modular product line extensions.

It is therefore an object of the invention to provide a leadless ballast.

Yet another object of the invention is to provide a leadless ballast which lends itself to mechanized manufacture thereby reducing the cost of the ballast.

Still another object of the invention is to provide a ballast which is mechanizable for fixture assembly to reduce fixture assembly labor costs.

Still another object of the invention is to provide a leadless ballast which permits an inventory reduction of ballasts.

Still another object of the invention is to provide a ballast having the potential of ballast weight reduction transportation savings.

Still another object of the invention is to provide a ballast designed such that the components thereof will operate at cooler temperatures thereby providing a longer life for the ballast.

Still another object of the invention is to provide a unitized bobbin having stand-offs extending therefrom to ensure that the core and coil subassembly will be spaced from the case and sides of the case.

Still another object of the invention is to provide a leadless ballast including a unitized bobbin having annular flanges extending therefrom which divides the bobbin into primary, secondary and cathode coil winding sections with each of the sections having the possibility of multiple compartments thereby providing for reduced layer-to-layer voltage stresses between conductors.

Still another object of the invention is to provide a unitized bobbin for a ballast having a single-ended axial termination to facilitate electrical connection thereof to a connector means adapted to be electrically connected to a wiring harness extending from a lamp fixture.

Still another object of the invention is to provide a bobbin for a ballast having bidirectional winding and conductor tab anchoring mechanisms.

Still another object of the invention is to provide a bobbin of the type described having a stand-off construction thereby providing additional dielectric insulation, reduced leakage currents and decreased vibration coupling from the ballast core to the case.

Still another object of the invention is to provide a bobbin for a ballast which is compatible to welded or clamp core lamination structure.

These and other objects of the present invention will be apparent to those skilled in the art.

Figure 13:
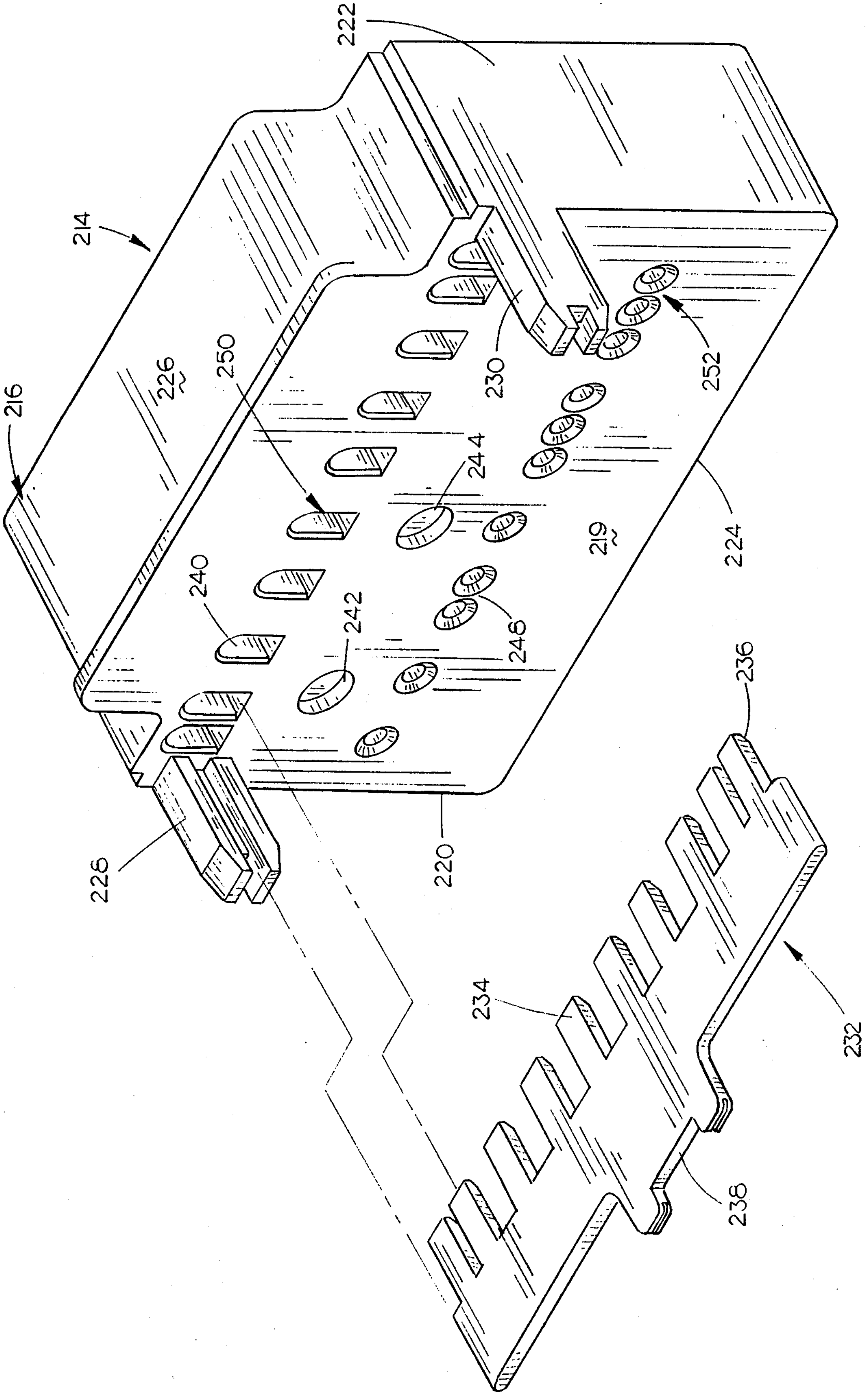
Figure 14:
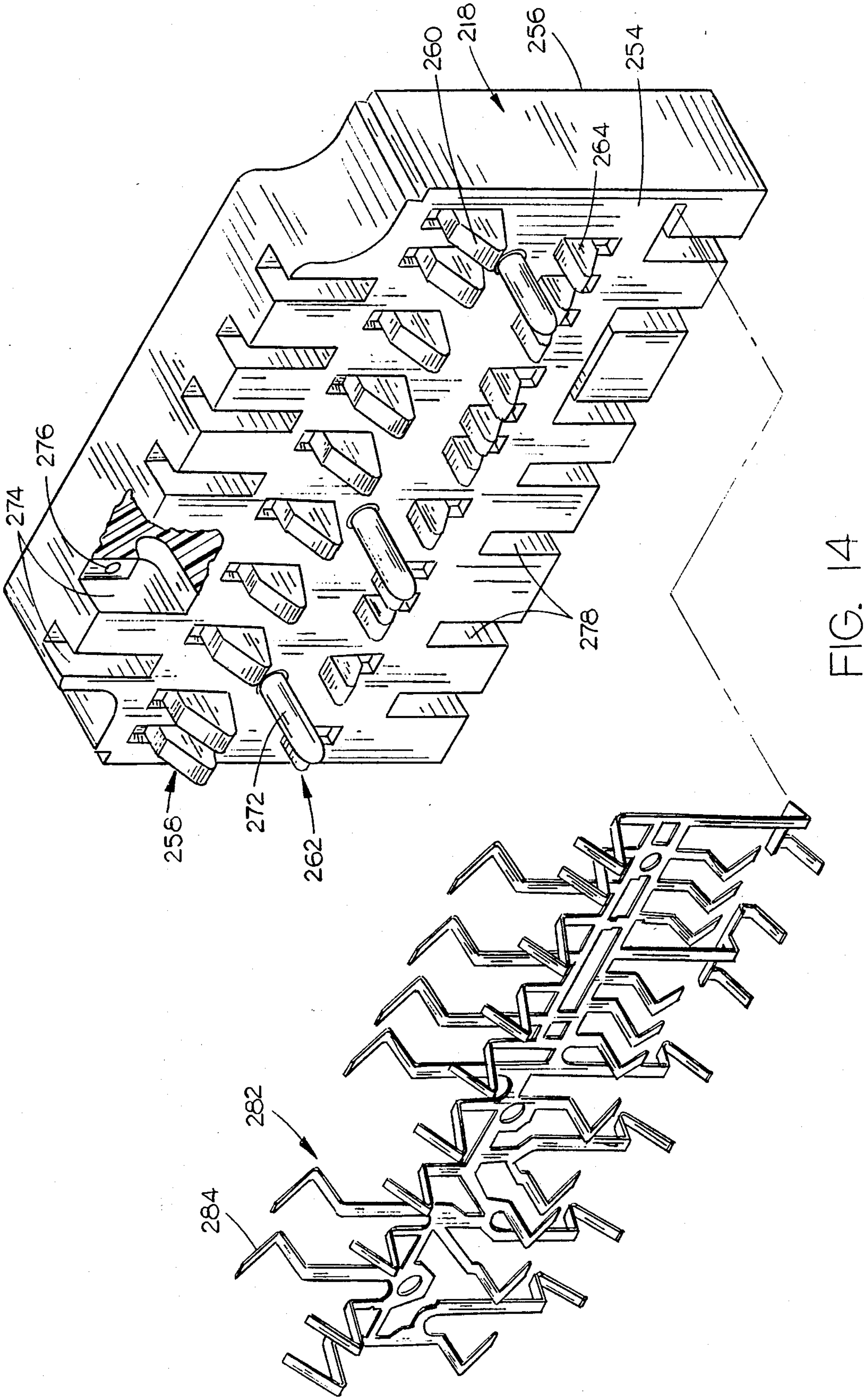
Figure 15:
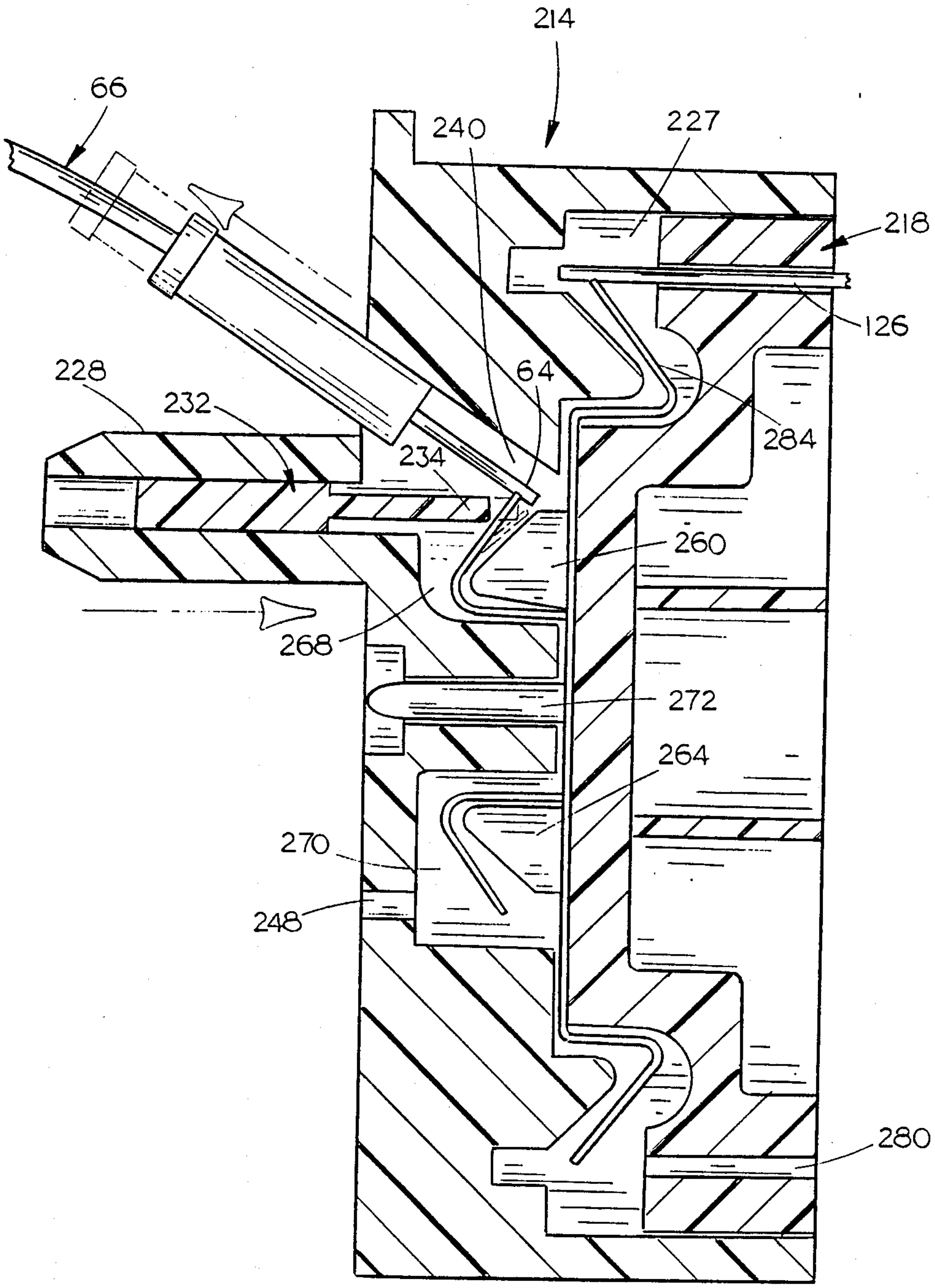
Figure 16:
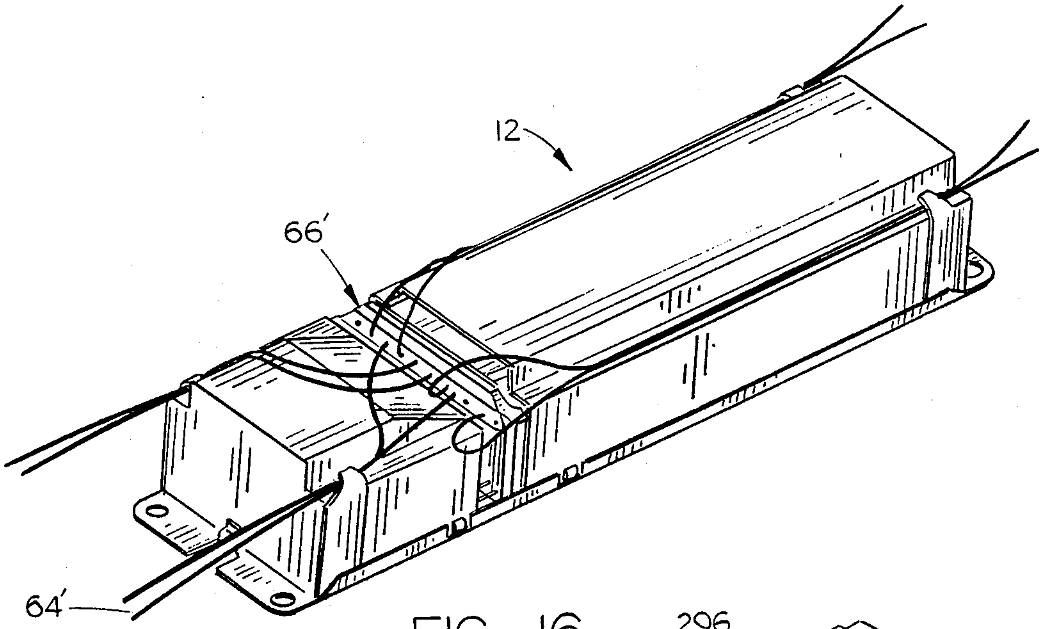
Figure 17:
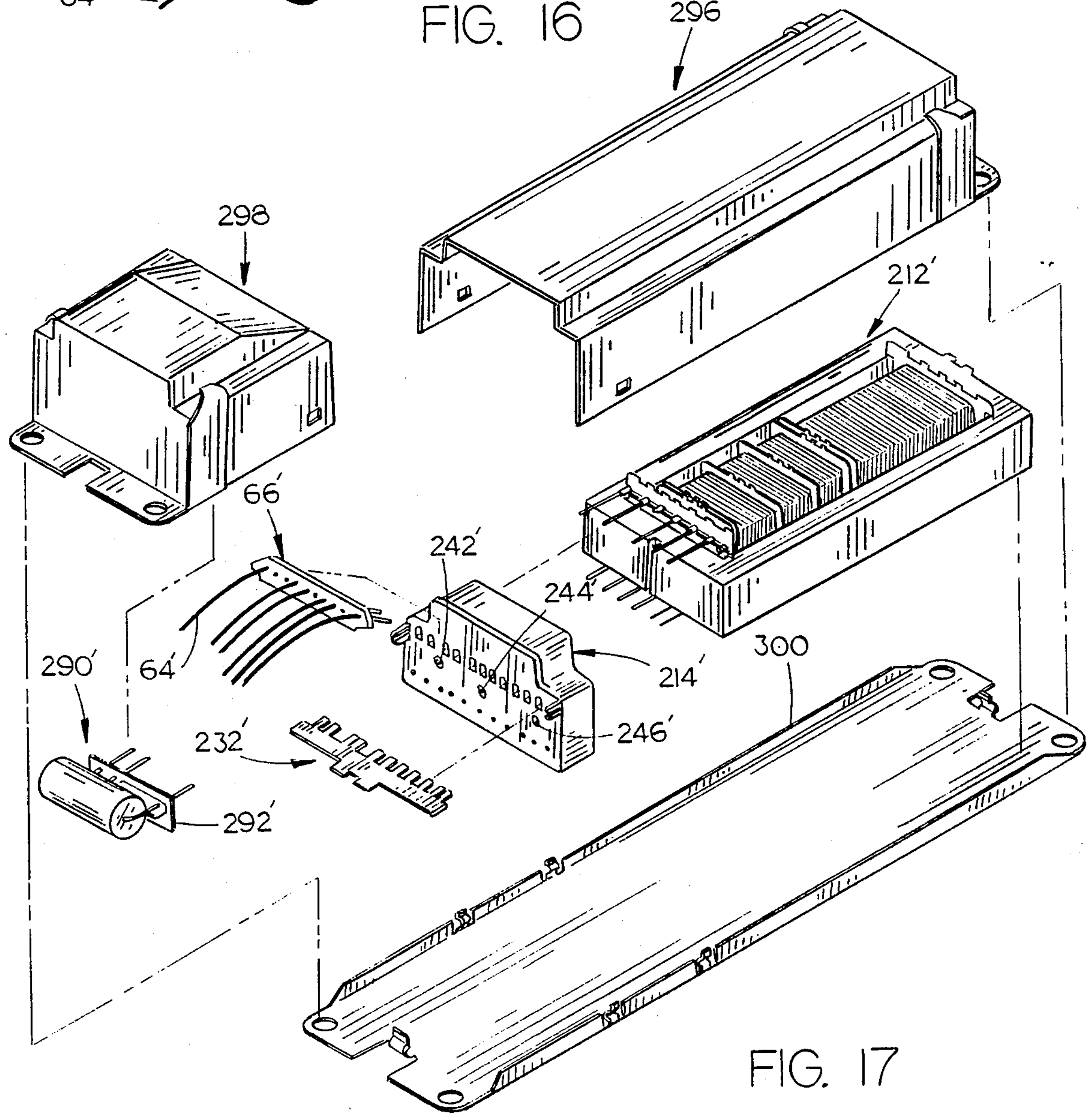
Figure 18:
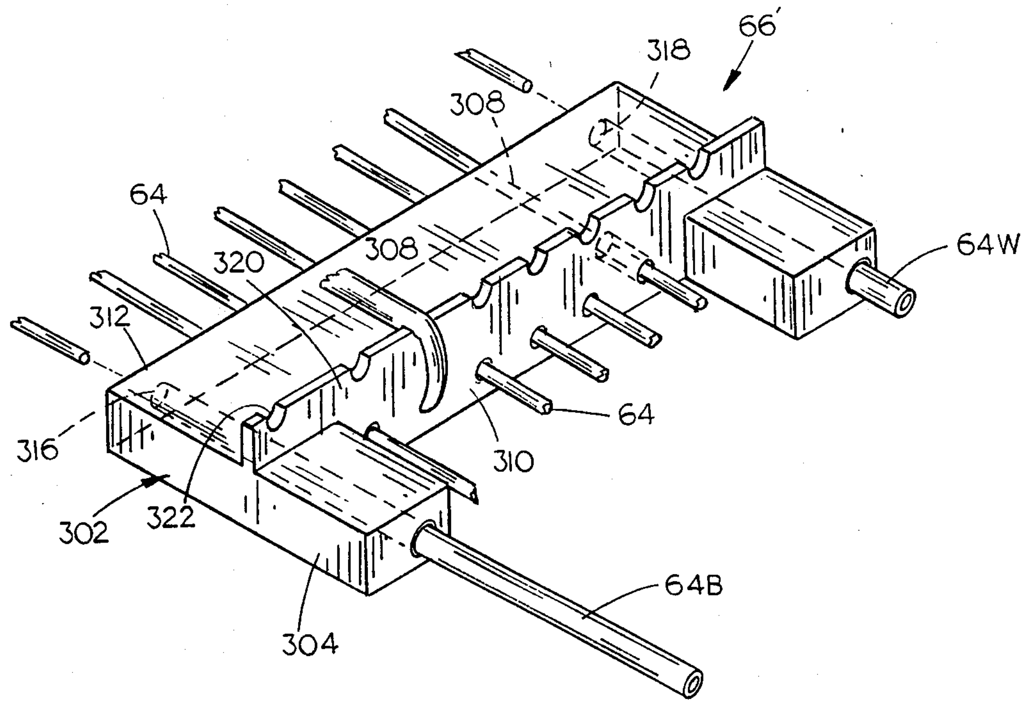
Figure 19:
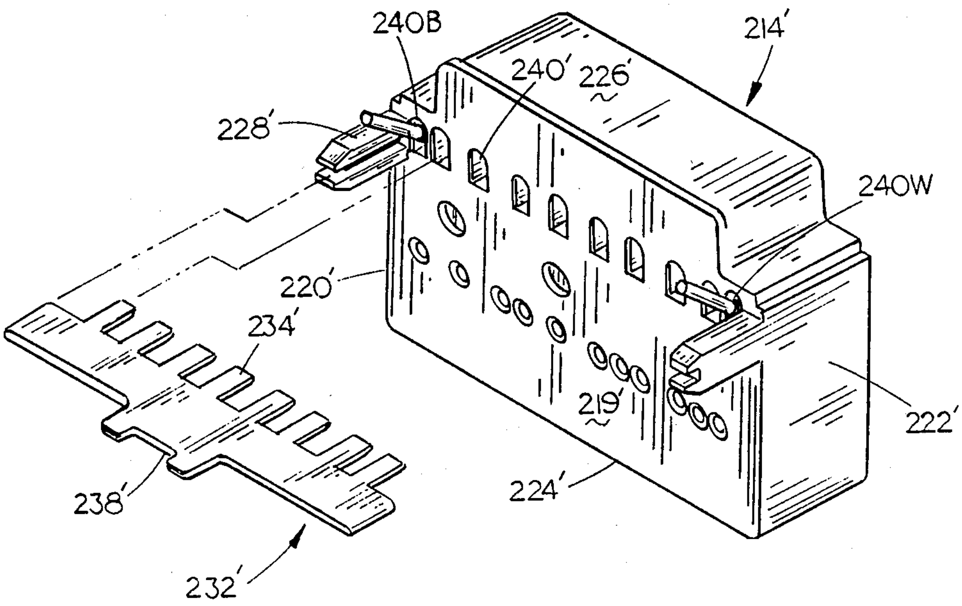

12 is an electrical schematic of a modified form of the circuitry of the invention:

FIG. 13 is a perspective view of the connector means and release comb:

FIG. 14 is an exploded rear perspective view of the connector means of FIG. 13 with a portion of the connector means cut away to more fully illustrate the invention:

FIG. 15 is a vertical sectional view of the connector means:

FIG. 16 is a perspective view of a modified form of the ballast of this invention;

FIG. 17 is an exploded perspective view of the embodiment of FIG. 16;

FIG. 18 is a perspective view of a modified form of the wiring harness which is plugged into the connector means; and FIG. 19 is a perspective view of the connector means with slight modifications thereto to accept the wiring harness of FIG. 18.

DESCRIPTION OF THE PREFERRED EMBODIMENT

The ballast of this invention is referred to generally by the reference numeral 10 in FIGS. 1–15 while the reference numeral 12 in FIGS. 16 and 17 refer to a modified form of the ballast.

Referring to FIGS. 1–15, the numeral 14 designates an elongated flat base having opposite ends 16 and 18, upstanding side edges 20 and 22, and top surface 24. Openings 26 and 28 are provided in end 16 while openings 30 and 32 are provided in end 16. Upstanding tabs 34 and 36 are also provided on ends 16 and 18 respectively.

Figure 1:
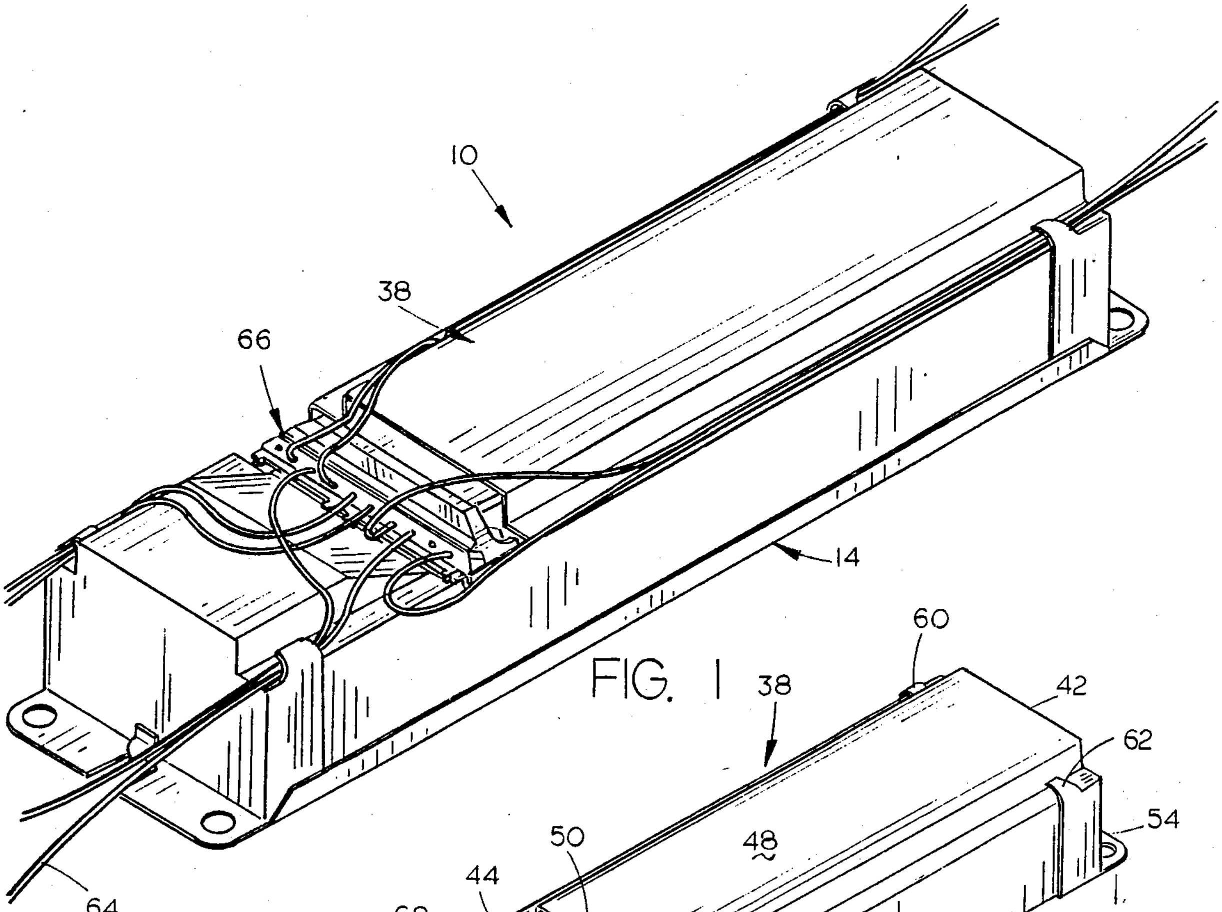
FIG. 1 is a perspective view of the ballast of this invention.
Figure 2:
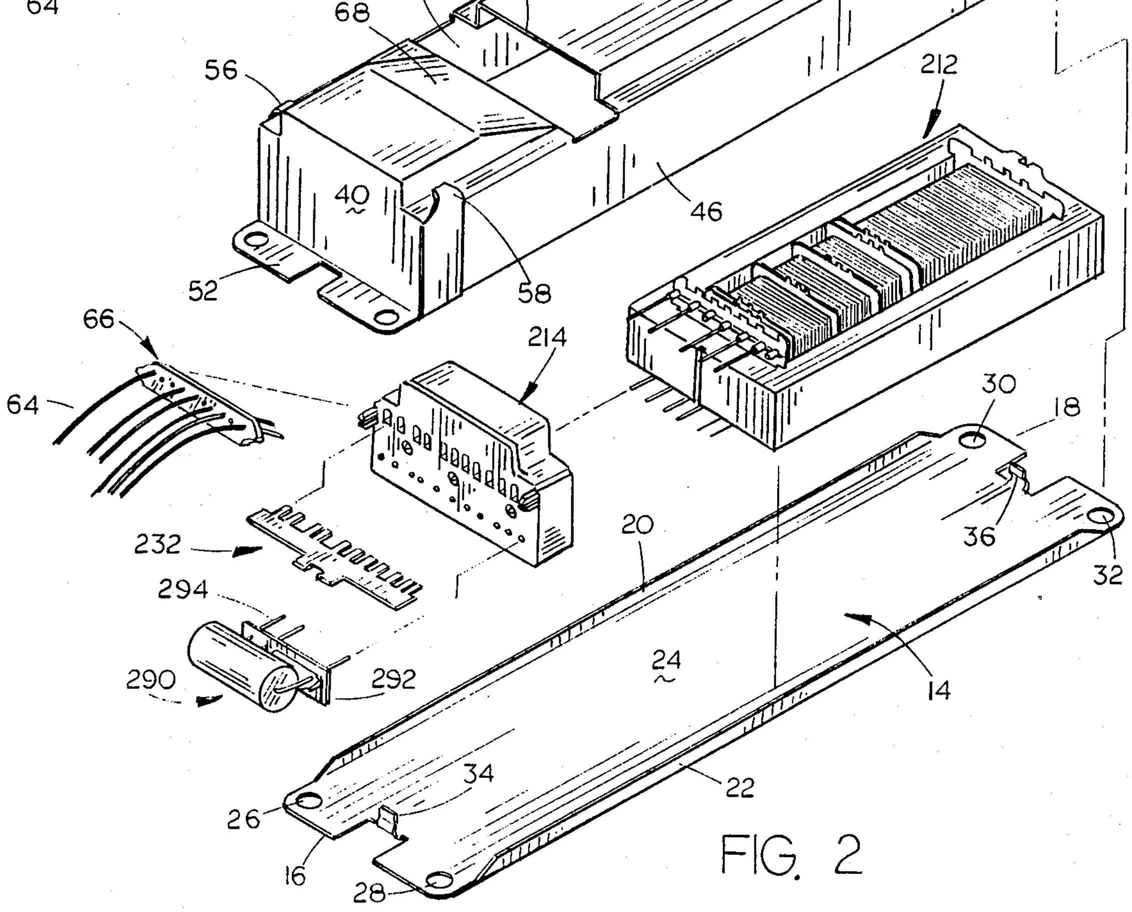
FIG. 2 is an exploded perspective view of the ballast of this invention.

Case or cover 38 is designed to extend over the components of the ballast and to be secured to base 14 as illustrated in the drawings. Case 38 includes upstanding ends 40 and 42 and upstanding sides 44 and 46. Case 38 is also provided with a top portion 48 having an access opening 50 formed therein. Flanges 52 and 54 extend laterally from the lower ends of end walls 40 and 42 respectively and have apertures or openings formed therein adapted to register with the openings 26, 30, 30 and 32. Case 38 is also provided with clamp portions 56, 58, 60 and 62 adapted to be bent over and clamped onto the various leads 64 of the wiring harness 66. As seen in FIG. 2, top portion 48 of case 38 has a tapered surface 68 formed thereon adapted to facilitate the angular insertion of one end of the wiring harness 66 through the access opening 44.

Figure 3:
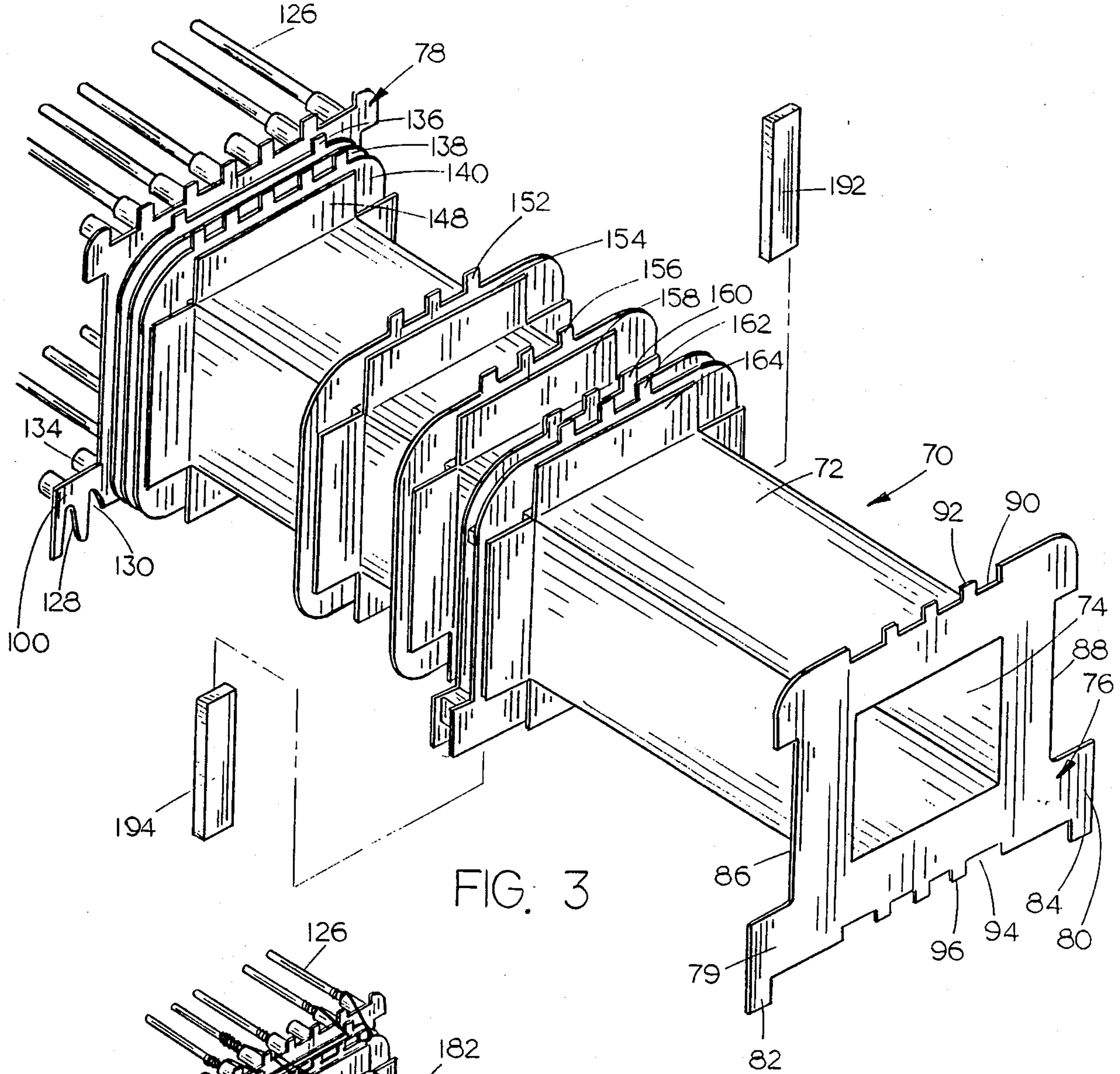
FIG. 3 is a perspective view of the bobbin portion of this invention.

The numeral 70 refers to the unitized bobbin or bobbin portion of this invention. Bobbin 70 is unique in itself and will function in ballasts other than in the leadless ballast of this invention. Further, the leadless ballast aspect of this invention will also accomplish all of its stated objectives even though the particular bobbin configuration of FIG. 3 is not utilized.

Bobbin 70 is comprised of a thermoplastic material and is provided with a substantially square body portion 72 having an opening 74 extending therethrough. Body 72 is provided with upstanding ends 76 and 78 at the opposite ends thereof. End 76 is provided with stand-offs 79 and 80 having downwardly extending foot portions 82 and 84 respectively. End 76 is provided with notches 86 and 88 extending into the sides thereof for purpose to be described in more detail hereinafter. The upper edge of end 76 is provided with a plurality of spaced-apart notches 90 separated by tabs 92. As seen in FIG. 3, the lower end of end 76 is also provided with a plurality of spaced-apart notches 94 separated by tabs 96 which serve as conductor tab anchoring mechanisms.

Figure 5:
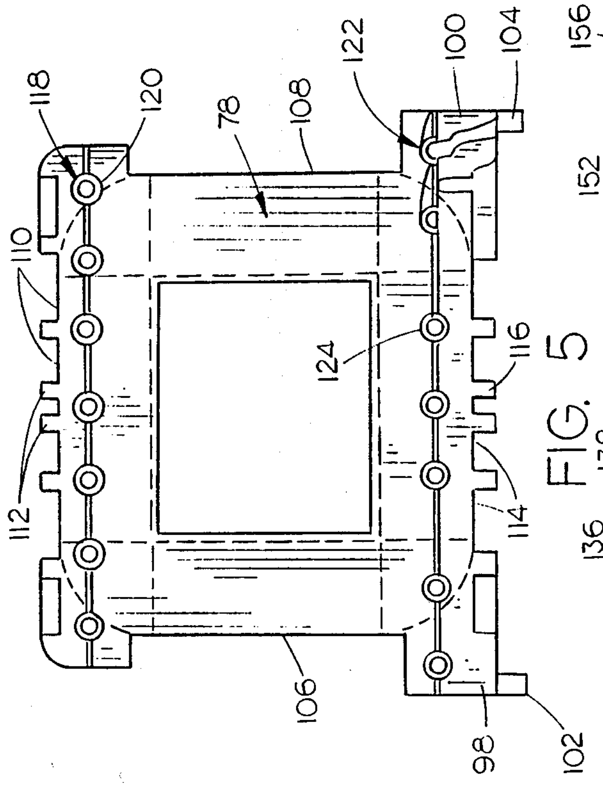
FIG. 5 is an end view of the bobbin as seen from the left of FIG. 4.

End 78 is provided with stand-offs 98 and 100 having downwardly extending foot portions 102 and 104 respectively. End 78 is provided with notches 106 and 108 extending into the sides thereof as best seen in FIG. 5. The upper edge of end 78 is provided with a plurality of notches 110 separated by tabs 112. The lower end of end 78 is provided with a plurality of notches 114 separated by a plurality of tabs 116.

Figure 4:
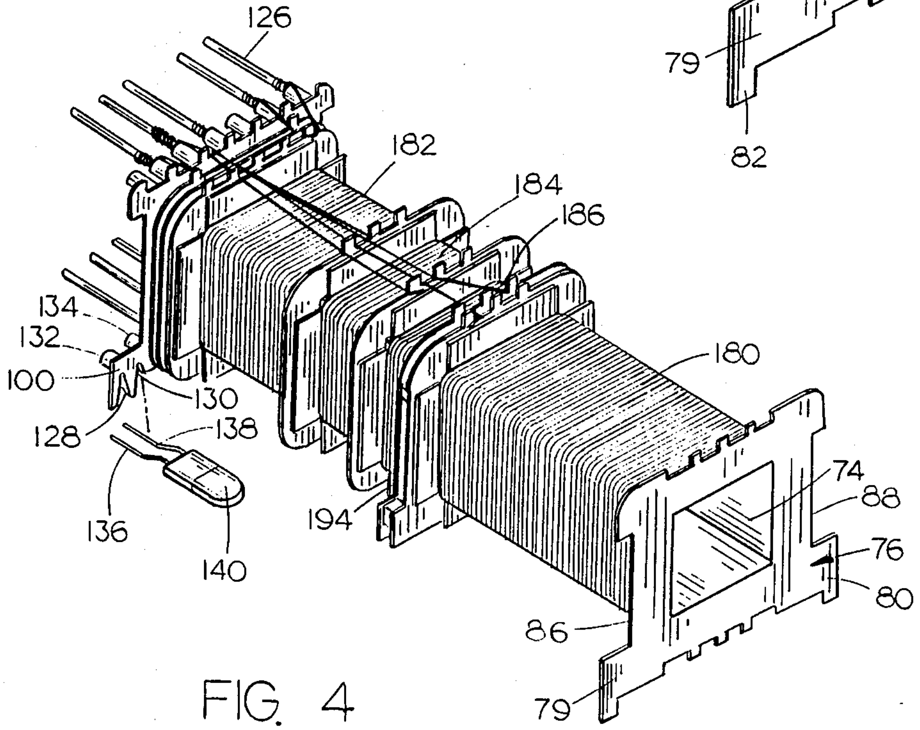
FIG. 4 is a perspective view of the bobbin having various windings mounted thereon.
Figure 6:
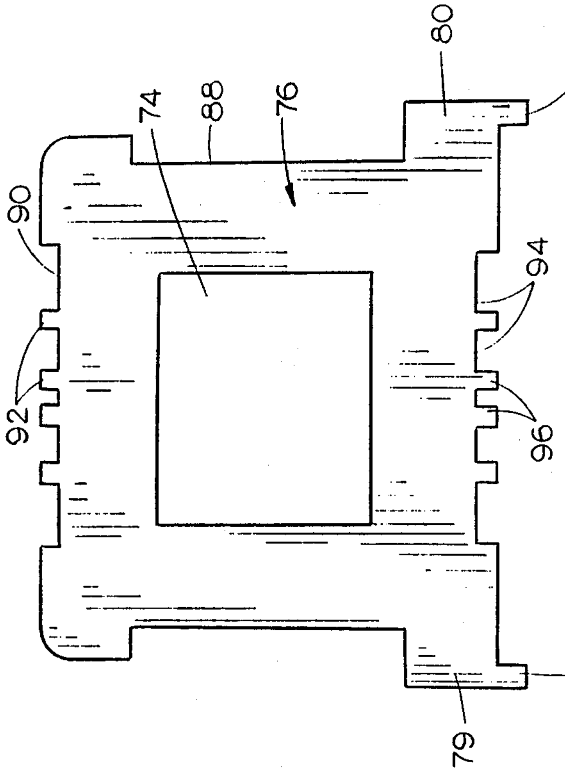
FIG. 6 is an end view of the bobbin as seen from the right of FIG. 4.

An upper row 118 of terminal pin supports 120 extend longitudinally from end 78 adjacent the upper end thereof while a lower row 122 of terminal pin supports 124 extend longitudinally from end 78 adjacent the lower end thereof. Terminal pins 126 are mounted in the terminal pin supports 120 and 124. As best seen in FIGS. 3 and 4, stand-off 100 is provided with a pair of inverted V-shaped grooves 128 and 130 which communicate with supports 132 and 134 which extend longitudinally therefrom. Leads or terminal pins 136 and 138 of thermal overload protector 140 extend through notches 128 and 130 and through the supports 132 and 134.

Figure 7:
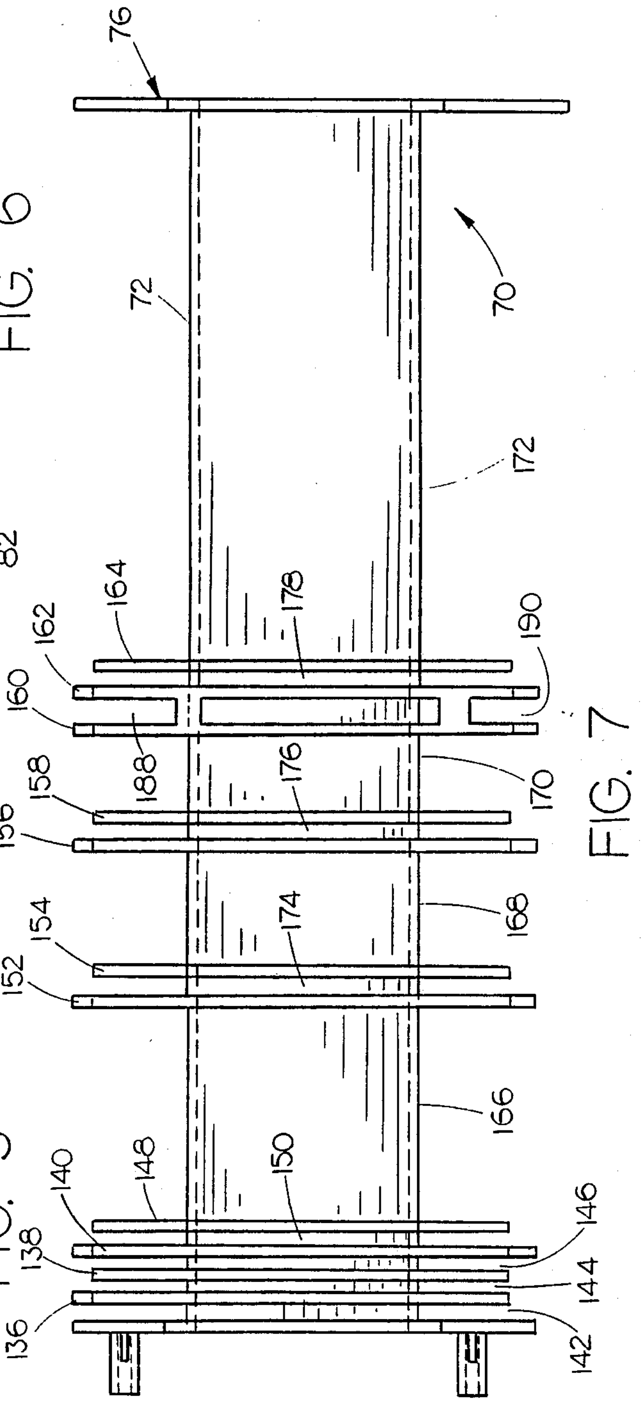
FIG. 7 is an elevational view of the bobbin.
Figure 11:
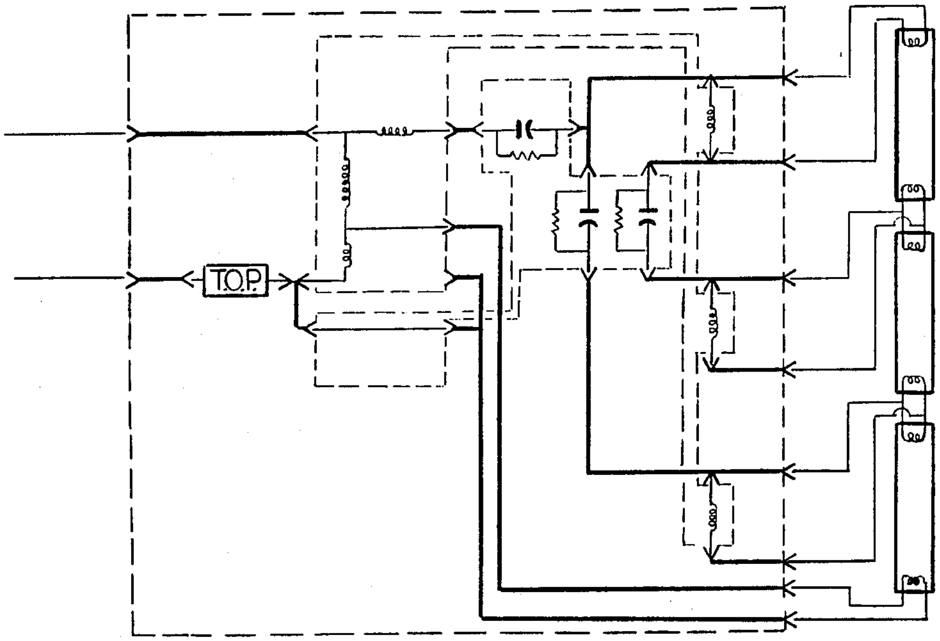
FIG. 11 is an electrical schematic of one form of the circuitry of the invention.
Figure 12:
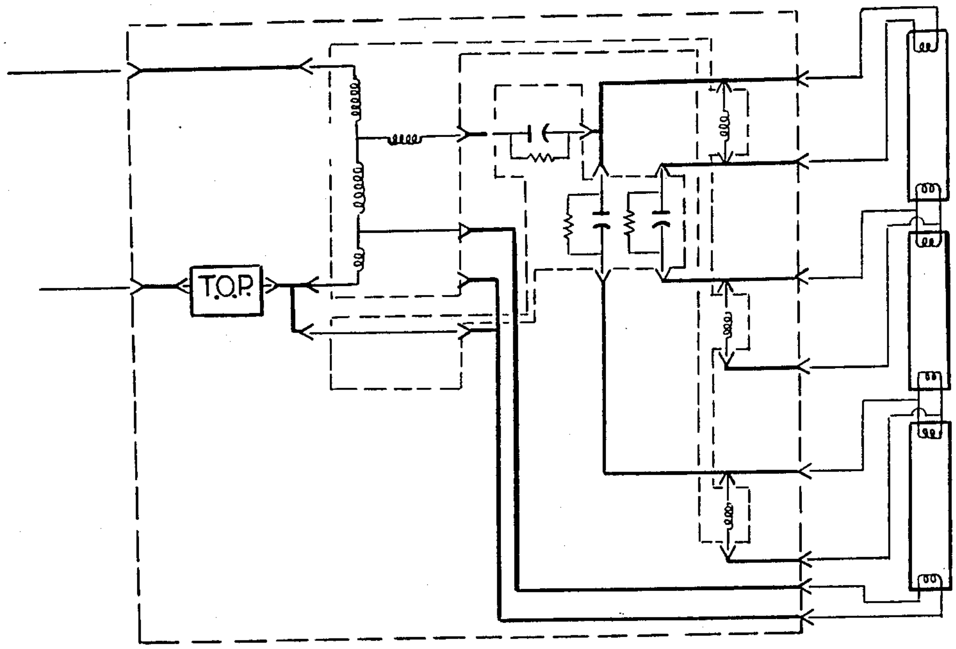

Flanges or walls 136, 138 and 140 extend radially from body portion 72 in a spaced-apart relationship to define cathode coil winding sections or compartments 142, 144 and 146 as illustrated in FIG. 7. Flange 148 is spaced from flange 140 to create a space 150 therebetween. Similarly, flanges 152, 154, 156, 158, 160, 162 and 164 extend radially outwardly from body 72 as seen in FIG. 7. The various flanges also have anchoring tabs provided on their upper and lower ends or edges. Flanges 148 and 152 create or define a primary coil winding section or compartment 166 while flanges 154 and 156 define a primary coil winding section or compartment 168. Flanges 158 and 160 define a coil winding section or compartment 170 which may or may not be used depending upon the particular ballast being manufactured. Flange 164 and end 76 define a secondary coil winding section or compartment 172. Flanges 152–154, 156–158 and 162–164 define spaces 174, 176 and 178 therebetween which are adapted to have terminations or ends of the coil windings extending therethrough as illustrated in the drawings. As seen in FIG. 4, layers of wire are wrapped around the bobbin 70 in section 172 to create a secondary coil winding 180. Layers of wire are wrapped around the body portion 72 in the sections 166, 168 and in some cases section 170 as seen in FIG. 4 to create primary coil windings 182 and 184. FIG. 4 illustrates a primary coil winding 186 but such a primary coil winding will not always be used as previously mentioned. The schematic of FIG. 12 illustrates a circuit wherein the third primary coil winding 186 is employed while the schematic of FIG. 11 illustrates only secondary coil windings 182 and 184 being employed Coils of wire are also wrapped around the body 72 in the spaces 142, 144 and 146 to create cathode coil windings. The terminations of the various coil windings are wrapped around the terminal pins 126 and soldered thereto in a predetermined fashion. As seen in FIG. 4, the conductors of the various coil windings are positioned in the notches formed in the various flanges or walls and anchored there by the tabs thereon. The provision of the spaces 174, 176 and 178 also permits the various coil windings to be tapped intermediate the lengths thereof.

Flanges 160 and 162 are provided with slots 184 and 186 adapted to detachably receive the shunts 188 and 190 respectively in a "snap-in" manner.

Although the drawings illustrate that the primary, secondary and cathode coil windings occupy a single section or compartment on the bobbin 70, each coil winding section could have multiple compartments, by using additional flanges, thereby providing for reduced layer-to-layer voltage stresses between conductors.

The bobbin construction described herein permits single ended axial termination to facilitate the use of a connector means as will be described hereinafter to provide all ballast external connections.

Although the preferred method of terminating the conductors is that shown in the drawings, other types of terminations could be utilized such as insulation displacement, fusion, wire wrap, chemical bonding, etc.

Further, the construction of the bobbin permits bidirectional winding for changing the polarity of the winding.

Figure 8:
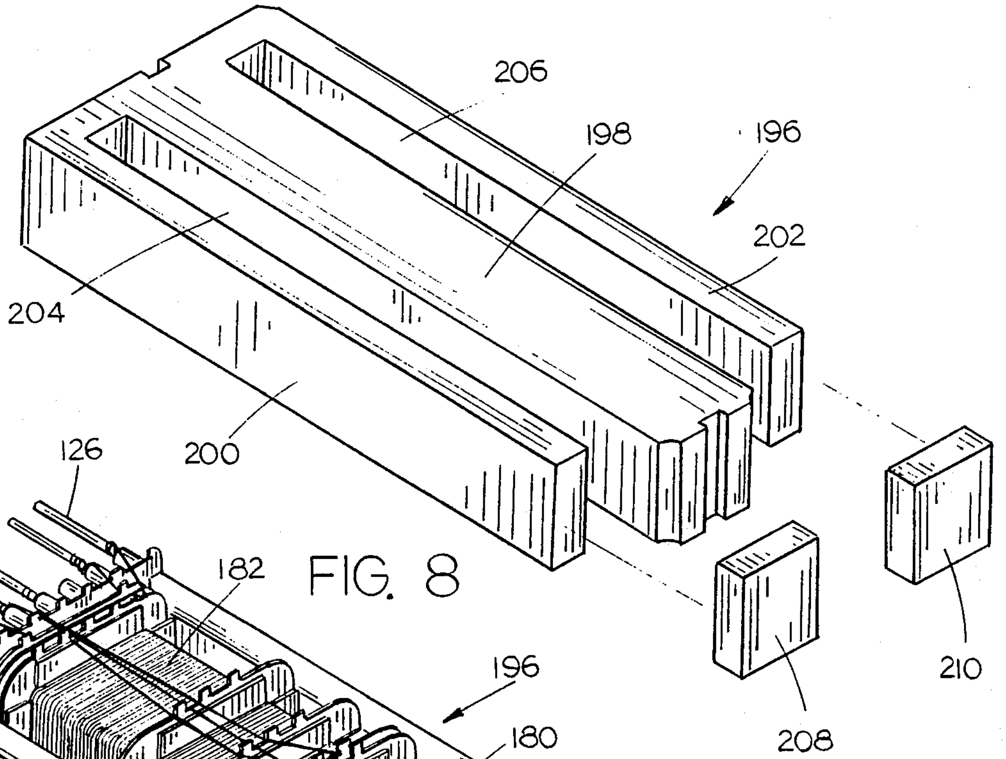
FIG. 8 is an exploded perspective view of the core.
Figure 9:
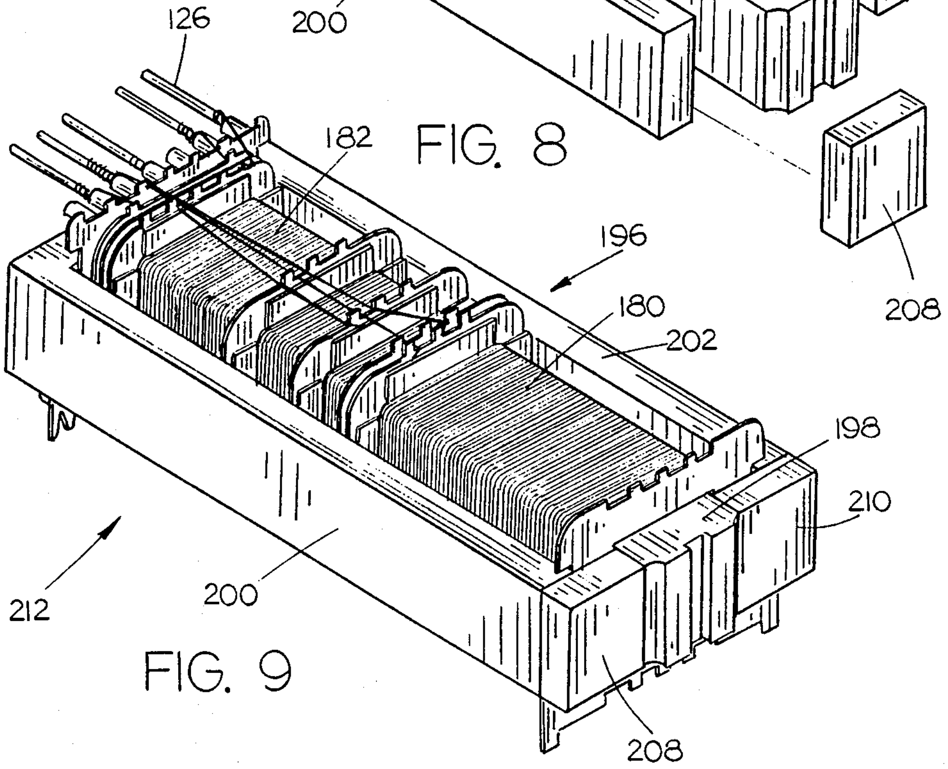
FIG. 9 is a perspective view illustrating the bobbin mounted on the core.
Figure 10:
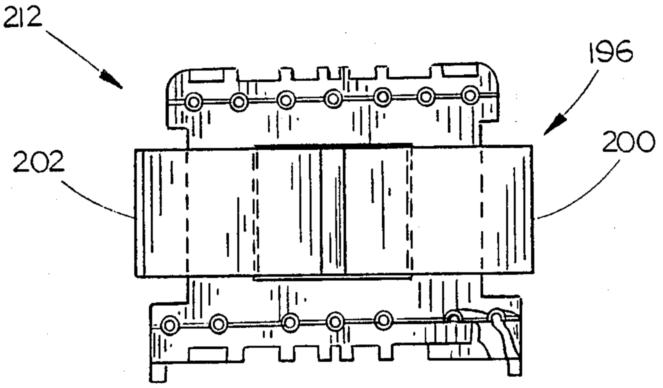
FIG. 10 is an end view of the assembly of FIG. 9 as seen from the left of FIG. 9.

The bobbin portion of this invention is adapted to be used with various types of core structures although the core structure illustrated in FIGS. 8 and 9 is the preferred type of core structure and is referred to generally by the reference numeral 196. For purposes of description, core 196 is of the laminated and welded type but could be comprised of the laminated and clamped type if so desired. Core 196 can be best described by being of the E-type construction including a central portion 198 having spaced-apart sides 200 and 202 defining gaps 204 and 206. Bobbin 70 is mounted on the center section 198 as illustrated in the drawings with the sides 200 and 202 being positioned in the notches formed at the sides of ends 76 and 78. As seen in FIG. 8, the ends of sides 200 and 202 terminate short of the end of center section 198. Ends 208 and 210 are mounted at the ends of the core as illustrated in FIG. 9 and are welded to the sides 200 and 202, and center section 198 by any convenient means. The notches 86 and 88 in end 76 and the notches 106 and 108 of end 78 serve to vertically position core 196 to space the core and the winding from the base 14.

For convenience of description, the numeral 212 will designate the core and coil subassembly. Core and coil subassembly 212 would normally be impregnated with an asphalt wax material and then would be encapsulated with an asphalt, silica sand potting compound and then positioned in case 38 at one end thereof. The numeral 214 refers to a connector means which is positioned at one end of the core and coil subassembly 212 as illustrated in the drawings. Connector means 214 includes an outer case member 216 and a cover member 218. For purposes of description, case member 216 will be described as having a front surface 219, opposite sides 220 and 222, lower end 224, an upper end 226, and a cavity 227 at its back side. A pair of longitudinally extending guides 228 and 230 extend from case member 214 adapted to slidably receive the release comb 232. Release comb 232 is provided with a plurality of spaced-apart teeth 234 having tapered end portions 236 formed thereon. As seen in FIG. 13, release comb 232 is also provided with a notch 238 formed therein. Teeth 234 are adapted to extend through the openings 240 formed in case member 216. Case member 216 is also provided with openings 242, 244 and 246 positioned below the openings 240. Case member 216 is also provided with a plurality of openings 248 formed therein as best seen in FIG. 13. For purposes of description, the openings 240 will be described as being arranged in an upper row of openings 250 while the openings 248 will be described as being arranged in a lower row of openings 252.

Cover member 218 is provided with inner and outer ends 254 and 256 respectively. As seen in FIG. 14, an upper row 258 of tapered lugs 260 are provided at the inner end of case member 218. As also seen in FIG. 14, a row 262 of tapered lugs 264 are also provided at the inner end of cover 218.

As seen in FIG. 15, cover member 218 is adapted to be received by the cavity 227 in the rearward side of case member 216 and the lugs 260 and 264 are adapted to be received by the openings 268 and 270 formed in case member 216. Tubular guides 272 extend from cover member 218 and are adapted to be received by the openings 242, 244 and 246 respectively. As seen in FIG. 14, cover member 218 is provided with a plurality of openings or notches 274 each of which communicate with an opening 276 extending through the upper portion of cover member 218. Cover member 218 is also provided with a plurality of notches 278 formed therein each of which communicate with an opening 280 extending through the lower portion of cover member 218. An electrical connector carrier strip 282 is positioned at the inner face of cover 218 and has a plurality of flexible, electrical connector elements 284 provided thereon. The various connector elements 284 are connected together in a predetermined pattern to provide the desired electrical circuitry as will be described in more detail hereinafter.

FIG. 14 illustrates the carrier strip 282 prior to the various electrical connector elements 284 being severed from the carrier strip. It should be understood that the carrier strip 282 is severed in such a manner to achieve the desired connector element configuration to provide the desired circuit between the various leads, terminals, etc.

As seen in FIG. 15, when a terminal pin 126 is extended through an opening 276, the inner end of the terminal pin 126 deflects and engages the upper end of an individual connector element 284 with the resiliency of the connector element 284 frictionally engaging the inner end of the terminal pin to maintain the terminal pin in electrical contact therewith. The same type of electrical contact is made when a terminal pin 126 is extended through one of the openings 280 for electrical contact with the lower end of one of the connector elements 284. Further, when a lead, terminal pin, etc. is extended through one of the openings 248, the lead will deflect the connector element 284 with the connector element then engaging the lead or terminal from becoming disconnected therefrom. The openings 240 are adapted to selectively removably receive the leads 64 at one end of the wiring harness 66 as seen in FIG. 15. As seen in FIG. 15, the leads 64 are extended downwardly through the openings 240 with the inner end of the leads being impinged by the upper end of one of the electrical connector elements 284 with the electrical connector element 284 maintaining the lead in electrical contact therewith. The leads 64 will remain in electrical contact with their respective electrical connectors 284 until the release comb 232 is moved inwardly so that the tapered portions on the teeth 234 thereon engage the upper ends of the electrical connector elements 284 to disengage the same from contact with the inner ends of the leads 64 thereby permitting the wiring harness 66 to be removed from its connection to the connector 214.

The numeral 290 refers to a component subassembly which will normally consist of at least one capacitor and at least one resistor which are sometimes mounted on a substrate 292 having terminal pins or terminations 294 extending therefrom. The terminals pins, leads or terminations 294 are adapted to be received by the openings 248. If only a capacitor is used, the substrate 292 will not normally be used with the leads of the capacitor being received by the openings 248.

Although the means by which the various leads, terminal pins, etc. are secured to the electrical connectors 284 is the preferred embodiment, other types of electrical connection means may also be employed without departing from the spirit of the invention.

Ballast 12 is essentially identical to ballast 10 except that the ballast case is comprised of two case portions 296 and 298 which may be mounted upon a base 300 or a pair of base portions. In FIGS. 16 and 17, the designation "'" will be used to indicate identical structure to that previously described. Case portion 298 would contain the component subassembly 290' therein while case portion 296 would contain all of the other components of the ballast except for the subassembly 290'. The embodiment of FIGS. 16 and 17 permits the basic ballast to be assembled and then fitted with the desired component subassembly 290' depending upon the particular light fixture with which the ballast will be used. The embodiment of FIGS. 16 and 17 therefore permits the ballast to be assembled in a "modular" type of fabrication depending upon the particular components to be utilized.

FIG. 18 illustrates a modified form of the wiring harness which is referred to generally by the reference numeral 66' and is designed to prevent any inadvertent contact with the black and white power lines during the connection of the wiring harness to the connector means 214. In FIGS. 18 and 19, the designation "'" will be employed to indicate identical structure to that previously described. Wiring harness 66, includes a block member 302 having a pair of block portions 304 and 306 extending outwardly therefrom as seen in FIG. 18. A plurality of bores 308 extend through block member 302 from side 310 to 312 adapted to receive the leads 64 therein so that the terminal ends thereof are exposed. The terminal ends of the leads 64 would be bare and would be received by the openings 240 of the connector means 214' illustrated in FIG. 19. The connector means 214' is essentially identical to the connector means 214 disclosed in FIG. 13 except that the outer most openings 240 in the row 250 are designated as openings *240b* and *240w* respectively. Connector pins pb and pw extend outwardly from openings *240b* and *240w* respectively and have their inner ends in electrical contact with the associated electrical connector positioned at the inner ends thereof. The pins pb and pw are adapted to be respectively received by the ends of bores 316 and 318 which extend through block member 302. Bores 316 and 318 extend completely through the block member 302 and are adapted to receive the leads *64b* and *64w* as illustrated in the drawings. A suitable electrical connector is provided in each of the bores 316 and 318 to provide an electrical connection between the pin pb and the lead *64b* and an electrical connection between the pin pw and the lead *64w* when the wiring harness is inserted into the connector means 214'. Thus, the wiring harness 66' can be plugged into the connector means 214' or disconnected therefrom without the bare wires of the black and white power wires *64b* and *64w* being exposed. As seen in FIG. 18, block member 302 is also provided with an upstanding shoulder 320 having a plurality of semi-circular notches 322 formed on the upper edge thereof which are adapted to receive any of the leads 64 which must be folded over and extended towards the other end of the ballast.

It can therefore be seen that the leadless ballast of this invention accomplishes at least all of its stated objectives. In particular, the leadless ballast of this invention permits the lamp fixture manufacturer to order a particular ballast and then connect the lamp fixture leads to the ballast thereby substantially reducing the required inventory normally associated with ballast manufacturing. Further, the fact that the wiring harness may be quickly and easily removed from the ballast permits the end user to replace a ballast should the same fail. Further, the ballast of this invention lends itself to mechanized fabrication since the construction of the ballast eliminates handling of troublesome leads during the fabrication of the ballast.

Construction of the ballast of this invention also lends itself for mechanized fixture assembly thereby reducing fixture assembly labor costs. Another advantage of the ballast of this invention is that there is a potential for a ballast weight reduction thereby reducing transportation costs. Further, the construction of the core and coil subassembly results in cooler component temperatures and greater efficiency for longer life. Yet another advantage of the ballast of this invention is that the bobbin construction ensures that the core and coil subassembly will be spaced from the case thereby resulting in sound and heat insulation advantages.

While preferred embodiments and modifications of the invention have been shown and described, various other embodiments and modifications thereof will become apparent to persons skilled in the art and will fall within the scope of the invention as defined in the following claims.

We claim:

1. A ballast for a fluorescent lamp, comprising, a base, a core means mounted on said base, a plurality of coils operatively electrically associated with said core means, each of said coils having at least one conductor extending therefrom, an electrical connector means positioned adjacent said coils and having a plurality of connectors associated therewith, means electrically connecting predetermined connectors to predetermined conductors, a component subassembly means electrically operatively connected to predetermined connectors of said electrical connector means, a case means positioned over said core means, coils, connector means and said component subassembly means, and being secured to said base, said case means having an access opening for providing access to at least a portion of said connector means whereby at least a portion of a wiring harness means may be inserted therethrough for selective connection to predetermined connectors of said electrical connector means.

2. The ballast of claim 1 wherein a conductor support means is positioned adjacent said coils, said conductor support means having a plurality of connector elements extending therefrom which are operatively electrically connected to predetermined connectors of said connector means, said conductors being electrically connected to said connector elements of said conductor support means.

3. The ballast of claim 2 wherein said connector elements comprise terminal pins.

4. The ballast of claim 2 wherein said component subassembly comprises at least one capacitor and at least one resistor having leads extending therefrom which are electrically connected to said predetermined connectors of said connector means.

5. The ballast of claim 3 wherein said connector means has upper and lower ends, and first and second sides, said connector means having a plurality of openings formed in one side thereof which operatively receive said terminal pins, said connector means having first and second rows of openings formed in its second side, each of said connectors providing an electrical circuit between a predetermined opening in said second row of openings with a predetermined opening in said first row of openings, or with a predetermined opening in said second side, or with a predetermined opening in said first row of openings with an opening in said second side, said component subassembly having electrical leads associated therewith which are received by the openings in said second row of openings, the wiring harness being received by said first row of openings.

6. A ballast for a fluorescent lamp, comprising:

a first case portion, a core means in said first case portion, a plurality of coils electrically associated with said core means, each of said coils having at least one conductor extending therefrom, an electrical connector means in said first case portion and being electrically connected to said conductors, said first case portion having an access opening formed therein adapted to have a wiring harness extending therethrough for removably connection to said connector means, a second case portion, a component subassembly in said second case portion and having a lead means extending outwardly from said second case portion, means connecting said lead means to said connector means, and means operatively securing said first and second case portions together.

7. The ballast of claim 6 wherein said component subassembly means comprises at least one resistor and at least one capacitor.

8. The ballast of claim 6 wherein a thermal overload protector is also provided in said first case portion and is electrically connected to said connector means.

9. The ballast of claim 6 wherein an encapsulating material encapsulates said core means and said coils in said first case portion.

10. In combination with a fluorescent light fixture having a wiring harness extending therefrom, a ballast comprising:

a base, a core means mounted on said base, a plurality of coils operatively electrically associated with said core means each of said coils having at least one conductor extending therefrom, an electrical connector means positioned adjacent said coils and having a plurality of connectors associated therewith, each of said connectors being electrically connected to at least one of said conductors, a component subassembly means electrically operatively connected to predetermined connectors, a case positioned over said core means, coils, connector means and said component subassembly means and being secured to said base, said case having an access opening formed therein for providing access to said connector means whereby at least a portion of the wiring harness may be selectively inserted therethrough for selective connection to predetermined connectors.

11. A core-coil means for a fluorescent lamp ballast, comprising:

an elongated rectangular bobbin having opposite ends, a top wall, a bottom wall, opposite side walls, and a central opening extending therethrough, said bobbin having a plurality of spaced apart flanges extending radially therefrom which define coil compartments, at least one primary winding wrapped around said bobbin in at least one of said compartments, at least one secondary winding wrapped around said bobbin in at least another of said compartments, a core means associated with said bobbin and comprising opposite end portions, opposite side portions, and a central portion extending between said side portions, said central portion of said core means being positioned in, and extending through, said central opening of said bobbin, said side portions of said core means being positioned outwardly of the side walls of said bobbin, said end portions of said core means being positioned outwardly of the ends of said bobbin.

12. The apparatus of claim 11 wherein at least some of said flanges have slots formed therein and wherein flat rectangular shunts are positioned in said slots.

13. The apparatus of claim 12 wherein said shunts are frictionally held in said slots.

14. The apparatus of claim 11 wherein an electrical conductor support means is positioned at one end of said bobbin; said electrical conductor support means having a plurality of electrical connectors mounted thereon, said coils being operatively electrically connected to said electrical connectors on said electrical conductor support means.

15. The apparatus of claim 14 wherein said electrical connectors comprise terminal pins extending from said support means.

16. The apparatus of claim 11 wherein cathode heating coils are also wrapped around said bobbin in certain of said compartments.

17. The apparatus of claim 11 wherein said bobbin has stand-offs extending from at least some of said flanges for facilitating the positioning of said bobbin and said core means in a ballast case in a spaced condition with respect thereto.

18. The apparatus of claim 11 wherein said bobbin has stakes extending therefrom for mounting said bobbin and core means in a ballast case.

19. The apparatus of claim 14 wherein said electrical conductor support means comprises a pair of horizontally extending and vertically spaced support bars, said support bars being positioned above and below one of said end portions of said core means.

20. The apparatus of claim 19 wherein said electrical connectors are mounted on said support bars.

21. The apparatus of claim 20 wherein said electrical connectors comprise terminal pins mounted on said support bars and extending therefrom.

22. The apparatus of claim 11 wherein said bobbin has a plurality of stand-offs extending therefrom which engage said core means to position said bobbin with respect to said core means.

23. The apparatus of claim 22 wherein said core-coil means is mounted in a ballast case and wherein said stand-offs space said core means and said windings from aid case.

24. The apparatus of claim 11 wherein said core means is formed of an E-shaped portion and a pair of I-shaped portions.

25. The apparatus of claim 24 wherein one end portion, said central portion, and said opposite side portions form said E-shaped portion, said I-shaped portions being secured to said side portions and said central portion to form the other end portion of said core means.

26. The apparatus of claim 25 wherein said central portion of said E-shaped portion is longer than the side portions thereof.

27. The apparatus of claim 25 wherein said E-shaped portion and said I-shaped portion are comprised of laminations.

28. The apparatus of claim 27 wherein said laminations are secured together by welding.

29. The apparatus of claim 11 wherein at least some of said flanges have positioning notches formed which receive the opposite side portions of said core means to vertically position said core means relative to said bobbin.

30. The apparatus of claim 11 wherein at least some of said flanges have conductor hold-down portions provided thereon.

31. The apparatus of claim 30 wherein said hold-down portions are provided on the upper and lower portions of said flanges.

32. The ballast of claim 1 including means for preventing inadvertent contact with the power wires of the wiring harness when the wiring harness is disconnected from the connector means.

33. The combination of claim 10 including means for preventing inadvertent contact with the power wires of the wiring harness when the wiring harness is disconnected from the connector means.

34. The combination of claim 10 wherein said connector means includes at least a pair of power pins extending therefrom which are electrically connected to predetermined connectors of said connector means and wherein the wiring harness includes a support member having a plurality of first bores extending therethrough, and at least a pair of second bores extending therethrough, said first bores adapted to receive some of the leads of the wiring harness extending therethrough so that the said leads may be electrically connected to the connectors of the connector means, one end of each of said second bores adapted to receive the power leads of the wiring harness, the other ends of said second bores adapted to receive the power pins which extend from said connector means, and an electrical connector in each of said second bores for providing electrical contact between the respective power leads and the power pins.

35. The ballast of claim 1 wherein said core means and coils are encased in a potting compound.

36. The ballast of claim 6 wherein said core means and coils are encased in a potting compound.

37. The combination of claim 10 wherein said core means and coils are encased in a potting compound.

38. The apparatus of claim 11 wherein said bobbin, windings and core means are encased in a potting compound.

* * * * *